(12) United States Patent
Yano et al.

(10) Patent No.: US 9,383,389 B2
(45) Date of Patent: Jul. 5, 2016

(54) PROBER AND NEEDLE-TIP POLISHING DEVICE FOR PROBE CARD

(71) Applicant: Tokyo Electron Limited, Tokyo (JP)

(72) Inventors: Kazuya Yano, Nirasaki (JP); Shuji Akiyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 32 days.

(21) Appl. No.: 14/601,573

(22) Filed: Jan. 21, 2015

(65) Prior Publication Data

US 2015/0204909 A1    Jul. 23, 2015

(30) Foreign Application Priority Data

Jan. 22, 2014  (JP) ................... 2014-009725

(51) Int. Cl.
*G01R 31/20*  (2006.01)
*G01R 1/073*  (2006.01)
*B24B 19/16*  (2006.01)
*G01R 3/00*  (2006.01)

(52) U.S. Cl.
CPC ............ *G01R 1/07342* (2013.01); *B24B 19/16* (2013.01); *G01R 1/073* (2013.01); *G01R 3/00* (2013.01)

(58) Field of Classification Search
CPC ...... G01R 1/73; G01R 1/7342; G01R 1/7314; G01R 1/7364; G01R 31/26; G01R 31/2831; G01R 31/2886
See application file for complete search history.

(56) References Cited

U.S. PATENT DOCUMENTS

| | | | | |
|---|---|---|---|---|
| 5,220,279 A | * | 6/1993 | Nagasawa | .......... G01R 1/07314 324/754.03 |
| 6,118,290 A | | 9/2000 | Sugiyama | |
| 7,345,466 B2 | * | 3/2008 | Vogtmann | ................. B08B 1/00 324/756.03 |
| 2005/0001645 A1 | | 1/2005 | Humphrey | |

FOREIGN PATENT DOCUMENTS

| | | |
|---|---|---|
| JP | 07-297242 A | 11/1995 |
| JP | 2003-059987 A | 2/2003 |
| JP | 2003-136386 A | 5/2003 |

* cited by examiner

*Primary Examiner* — Minh N Tang
(74) *Attorney, Agent, or Firm* — Pearne & Gordon LLP (57) ABSTRACT

A prober 10 including a probe card 16 having multiple probe needles 17 includes a needle-tip polishing unit 24, and the needle-tip polishing unit 24 includes a WAPP 28 to be contacted with needle tips and a supporting member 27 configured to support the WAPP 28. On a top surface of the WAPP 28, a wrapping sheet 29 is provided, and the WAPP 28 includes multiple recesses 31 formed on a bottom surface 30 thereof and the supporting member 27 includes multiple protrusions 33 formed on a ceiling surface 32 thereof. When the WAPP 28 is moved to a retreat position, the protrusions 33 are respectively inserted and fitted into the recesses 31, and when the WAPP 28 is moved to a contact position, top portions of the protrusions 33 are respectively brought into contact with portions on the bottom surface 30 where the recesses 31 are not formed.

6 Claims, 9 Drawing Sheets

PROBER AND NEEDLE-TIP POLISHING DEVICE FOR PROBE CARD

CROSS-REFERENCE TO RELATED APPLICATION

This application claims the benefit of Japanese Patent Application No. 2014-009725 filed on Jan. 22, 2014, the disclosures of which are incorporated herein by reference.

TECHNICAL FIELD

The embodiments described herein pertain generally to a prober and a needle-tip polishing device for a probe card.

BACKGROUND

A prober has been known as a substrate inspection apparatus that inspects electrical characteristics of semiconductor devices, for example, a power device or a memory, formed on a semiconductor wafer (hereinafter, simply referred to as "wafer") serving as a substrate.

The prober includes a circular plate-shaped probe card having a multiple number of probe needles; and a stage which mounts the wafer thereon and freely moves up and down or from side to side. As the stage mounting the wafer thereon is moved toward the probe card, the respective probe needles of the probe card are allowed to be brought into contact with electrode pads or solder bumps of the semiconductor devices. Then, by allowing an electric current for inspection to flow to the electrode pads or the solder bumps through the respective probe needles, the electrical characteristics of the semiconductor devices are inspected (see, for example, Patent Document 1).

In the prober, the probe needles of the probe card are repeatedly brought into contact with the respective electrode pads, so that tips of the needles may be abraded. Therefore, it is necessary to regularly polish the needle tips of the probe needles.

Figure 9A:
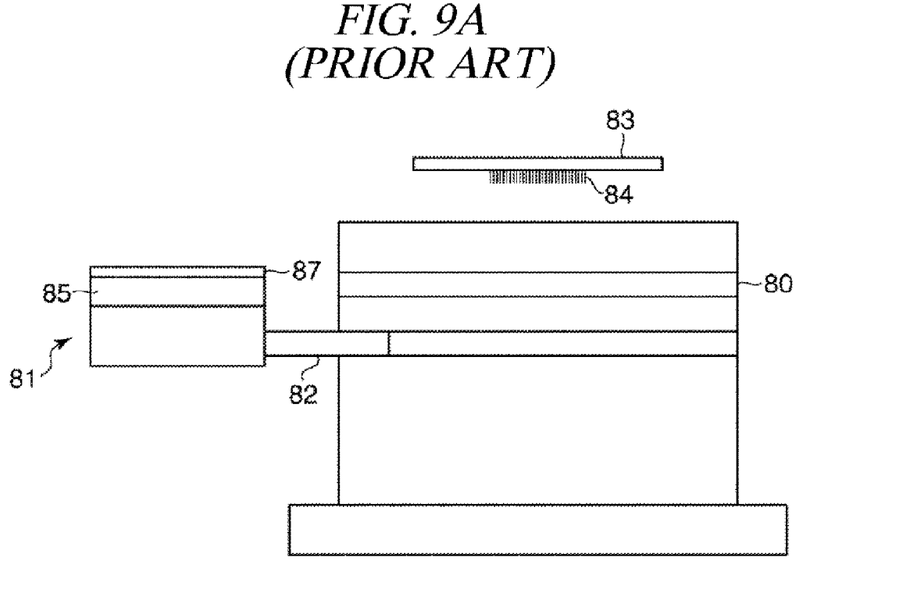
FIG. 9A illustrates a case where the needle-tip polishing unit is located at a retreat position.
Figure 9B:
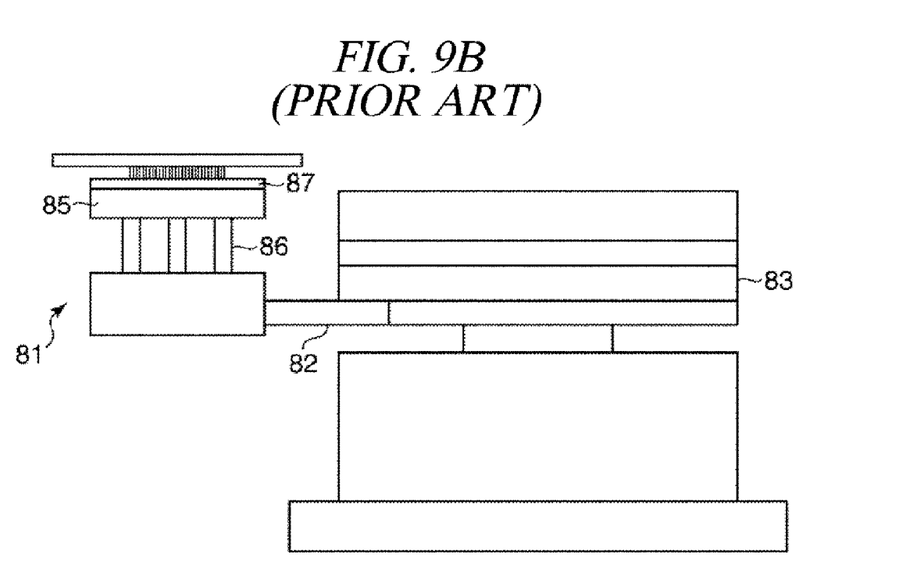
FIG. 9B illustrates a case where the needle-tip polishing unit is located at a contact position.

Typically, the needle tips of the probe needles are polished by a needle-tip polishing device provided at a side of the stage. To be specific, as depicted in FIG. 9A, a needle-tip polishing device 81 provided at a side of a stage 80 is fixed to a the stage 80 by a stay 82, and the stage 80 is moved in a horizontal direction to arrange the needle-tip polishing device 81 to face probe needles 84 of a probe card 83. A wide area polish plate (hereinafter, simply referred to as "WAPP") 85 constituting an upper portion of the needle-tip polishing device 81 is moved toward the probe card 83 by a hydraulic cylinder 86 of the needle-tip polishing device 81, and the stage 80 is also moved toward the probe card 83 (FIG. 9B) to bring a needle-tip polishing sheet (wrapping sheet) 87 provided on a needle-tip polishing surface of the WAPP 85 into contact with needle tips of the respective probe needles 84.

Recently, an increase in a diameter of a wafer has been considered. However, as a probe card is increased in size, the bending of the wafer or the probe card is increased. In this case, in order to reliably bring the probe needles of the probe card into contact with the electrode pads of the semiconductor devices, a load of the stage to press the wafer to the probe card needs to be further increased.

Patent Document 1: Japanese Patent Laid-open Publication No. H07-297242

When the needle tips of the probe needles are polished, the stage is also driven as described above. Therefore, as the load of the stage to press the wafer against the probe card is increased, a load applied to the WAPP to press the wrapping sheet of the WAPP against the probe needles is also increased. At this time, a reaction force corresponding to the load applied to the WAPP is received by the respective probe needles. The reaction force is increased since it is proportional to the load applied to the WAPP. As a result, a hydraulic cylinder of the needle-tip polishing device cannot respond to the increased reaction force, so that it becomes difficult for the hydraulic cylinder to press the wrapping sheet of the WAPP against the probe needles.

SUMMARY

An object of the example embodiments is to provide a needle-tip polishing device for a probe card and a prober capable of reliably pressing a needle-tip polishing surface against probe needles of the probe card.

In one example embodiment, a prober has a stage that mounts a substrate thereon and a probe card that is provided to face the stage and has multiple probe needles protruded toward the mounted substrate. The prober further includes a needle-tip polishing device configured to polish needle tips of the multiple probe needles. Further, the needle-tip polishing device includes a needle-tip contact unit contacted with the needle tips and a supporting unit configured to support the needle-tip contact unit. Furthermore, a needle-tip polishing surface configured to polish the needle tips is formed on a portion of the needle-tip contact unit which is contacted with the needle tips, and the needle-tip contact unit is provided between the probe card and the supporting unit and moved between a retreat position where the needle-tip contact unit is not in contact with the needle tips and a contact position where the needle-tip contact unit is in contact with the needle tips. Moreover, the needle-tip contact unit includes a first facing surface provided to face the supporting unit, and the supporting unit includes a second facing surface provided to face the needle-tip contact unit. The needle-tip contact unit and the supporting unit include an engagement unit configured to be mechanically engaged with each other such that the first facing surface and the second facing surface are maintained to be separated from each other when the needle-tip contact unit is moved to the contact position and receive a reaction force from the needle tips.

In another example embodiment, a needle-tip polishing device that polishes needle tips of multiple probe needles protruded from a probe card toward a substrate includes a needle-tip contact unit contacted with the needle tips; and a supporting unit configured to support the needle-tip contact unit. Further, a needle-tip polishing surface configured to polish the needle tips is formed on a portion of the needle-tip contact unit which is contacted with the needle tips, and the needle-tip contact unit is provided between the probe card and the supporting unit, and moved between a retreat position where the needle-tip contact unit is not in contact with the needle tips and a contact position where the needle-tip contact unit is in contact with the needle tips. Furthermore, the needle-tip contact unit includes a first facing surface provided to face the supporting unit, and the supporting unit includes a second facing surface provided to face the needle-tip contact unit. Moreover, the needle-tip contact unit and the supporting unit include an engagement unit configured to be mechanically engaged with each other such that the first facing surface and the second facing surface are maintained to be separated from each other when the needle-tip contact unit is moved to the contact position and receives a reaction force from the needle tips.

According to the example embodiments, in the needle-tip polishing device, the needle-tip contact unit and the supporting unit include engagement portions which are mechanically engaged with each other such that when the needle-tip contact unit provided between the probe card and the supporting unit is moved to the contact position and receives a reaction force from the needle tips, the first facing surface of the needle-tip contact unit and the second facing surface of the supporting unit can be maintained to be separated from each other. Thus, the needle-tip contact unit cannot be returned to the retreat position from the contact position by the reaction force from the needle tips. As a result, the needle-tip contact unit can stay at the contact position, so that it is possible to reliably press the needle-tip polishing surface to the needle tips of the probe needle of the probe card.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A to FIG. 4D are diagrams provided to explain shapes of a WAPP and a supporting member of the needle-tip polishing unit of FIG. 3, and specifically.

FIG. 8A to FIG. 8C are schematic cross-sectional views respectively illustrating third to fifth modification examples of the needle-tip polishing unit of FIG. 3, and specifically, FIG. 8A illustrates the third modification example, FIG. 8C illustrates the fifth modification example; and FIG. 9A and FIG. 9B are side views schematically illustrating a configuration of a conventional needle-tip polishing unit, and specifically.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments will be explained with reference to the accompanying drawings.

Figure 1:
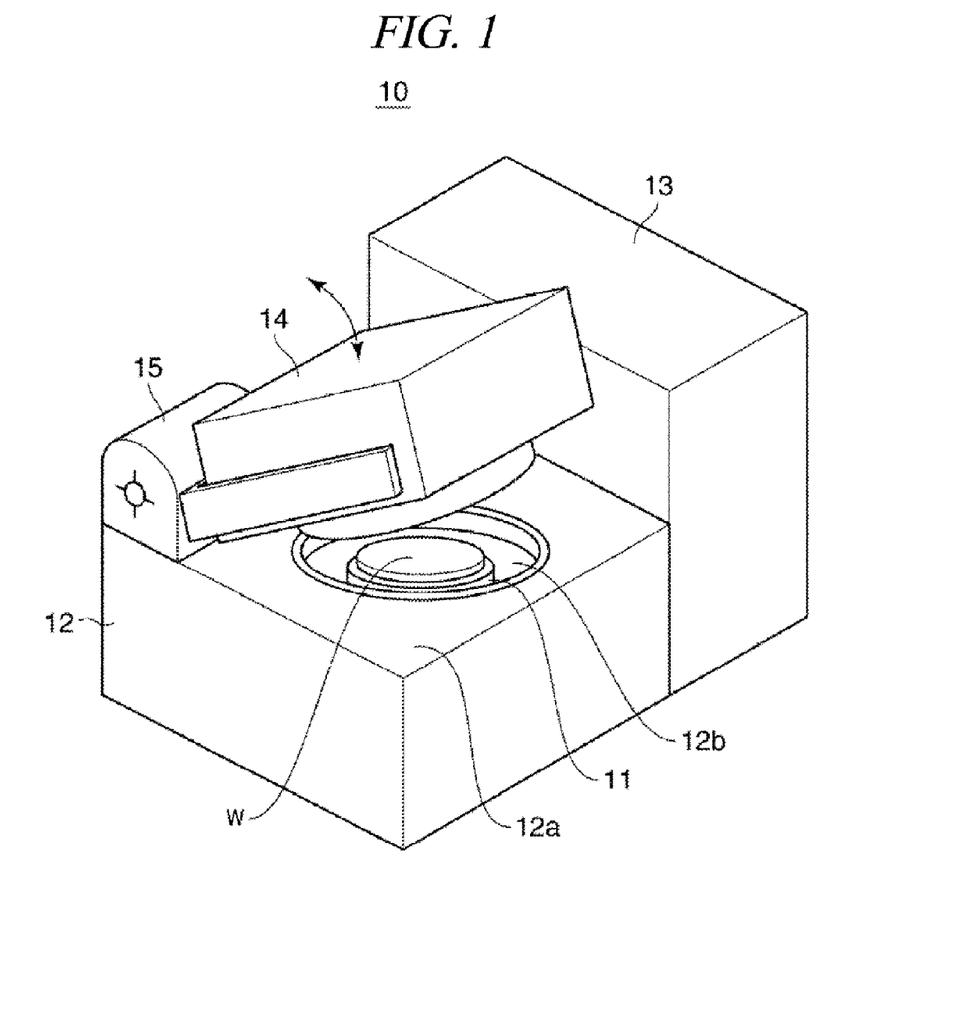
FIG. 1 is a perspective view schematically illustrating a configuration of a prober in accordance with a first example embodiment.

FIG. 1 is a perspective view schematically illustrating a configuration of a prober in accordance with a first example embodiment.

In FIG. 1, a prober 10 includes a main body 12 that accommodates therein a stage 11 configured to mount a wafer W thereon; a loader 13 provided to be adjacent to the main body 12; and a test head 14 provided to cover the main body 12. The prober 10 is configured to inspect electrical characteristics of semiconductor devices formed on the wafer W having a larger diameter of, for example, 300 mm or 450 mm.

The main body 12 has a hollow housing shape therein, and at a ceiling portion 12a thereof, an opening 12b opened above the wafer W mounted on the stage 11 is formed. This opening 12b is engaged with a probe card holder (not illustrated) having a substantially circular plate shape, and the probe card holder is configured to hold a circular plate-shaped probe card 16 (see FIG. 2 to be described later). Thus, the probe card 16 is arranged to face the wafer W mounted on the stage 11.

The test head 14 has a hexahedral shape and is configured to be upwardly rotated by a hinge device 15 provided on the main body 12. When the test head 14 covers the main body 12, the test head 14 is electrically connected with the probe card 16 via a contact ring (not illustrated). Further, the test head 14 includes a data storage unit configured to store, as measurement data, electrical signals which are outputted from the probe card 16 and indicate electrical characteristics of the semiconductor devices; and a determination unit configured to determine, based on the measurement data, whether or not there is an electrical defect of the semiconductor devices on the wafer W as an inspection target (all of which are not illustrated).

The loader 13 is configured to unload the wafer W on which the semiconductor devices are formed and which will be accommodated in a FOUP (not illustrated) as a transfer container and mount the wafer W on the stage 11 of the main body 12. Further, the loader 13 is configured to unload the wafer W, on which the inspection for the electrical characteristics of the semiconductor devices is completed, from the stage 11 and return the wafer W back into the FOUP.

On a surface of the probe card 16 facing the stage 11, multiple probe needles 17 are arranged (see FIG. 3 to be described later). The stage 11 brings electrode pads of the semiconductor devices into contact with the respective probe needles 17 by adjusting a relative position between the probe card 16 and the wafer W.

When the electrode pads of the semiconductor devices are brought into contact with the corresponding probe needles 17, the test head 14 allows an inspection electric current to flow to the semiconductor devices via the probe needles 17 of the probe card 16. Then, the probe card 16 corresponding electrical signals showing the electrical characteristics of the semiconductor devices to the data storage unit of the test head 14. The data storage unit stores the received electrical signals as measurement data, and the determination unit determines whether or not there is an electrical defect of the semiconductor devices of the inspection target based on the stored measurement data.

Figure 2:
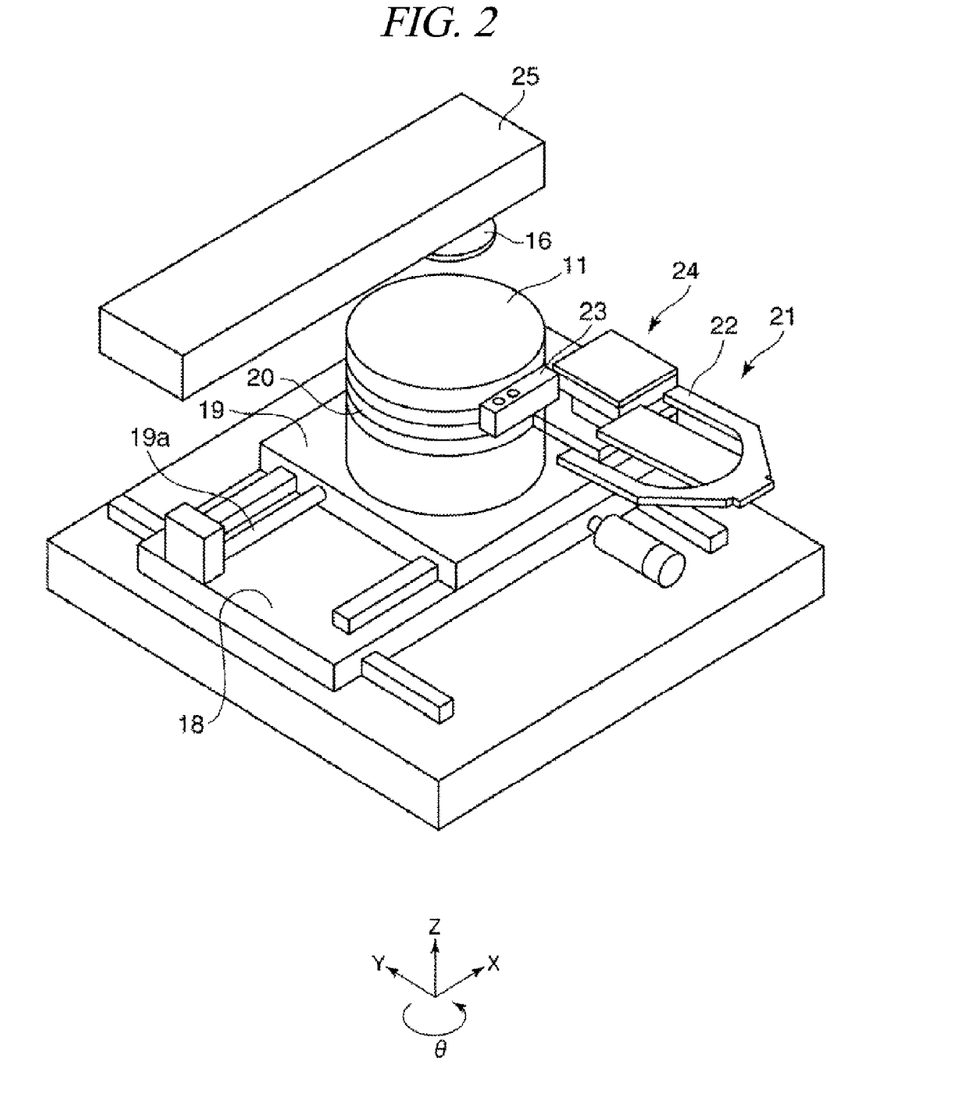
FIG. 2 is a perspective view schematically illustrating an internal configuration of a main body of the prober of FIG. 1.

FIG. 2 is a perspective view schematically illustrating an internal configuration of the main body of the prober of FIG. 1.

In FIG. 2, the stage 11 is supported by a Y-direction moving unit 18 configured to be moved along a Y-direction defined in the drawing; an X-direction moving unit 19 configured to be moved along an X-direction defined in the drawing; and a Z-direction moving unit 20 configured to be moved along a Z-direction defined in the drawing. As a result, the stage 11 can be moved toward the probe card 16.

The Y-direction moving unit 18 is precisely moved in the Y-direction by rotating a ball screw (not illustrated) provided along the Y-direction, and the ball screw is rotated by a Y-direction moving unit motor (not illustrated) as a step motor. The X-direction moving unit 19 is precisely moved in the X-direction by rotating a ball screw 19a provided along the X-direction, and the ball screw 19a is rotated by an X-direction moving unit motor (not illustrated) as a step motor. Further, the stage 11 is provided to be rotatable on the Z-direction moving unit 20 in a θ-direction shown in the drawing, and the wafer W is mounted on this stage 11.

That is, the Y-direction moving unit 18, the X-direction moving unit 19, and the Z-direction moving unit 20 can move the stage 11 in the Y-direction, the X-direction, and the Z-direction, respectively, in the drawing, so that the stage 11 mounting the wafer W thereon is moved to face the probe card 16. In particular, the Z-direction moving unit 20 moves the stage 11 toward the probe card 16 along the Z-direction in the drawing, so that the electrode pads of the semiconductor devices on the wafer W are brought into contact with the corresponding probe needles 17, respectively.

Within the main body 12, a probe card holder guide 21 is provided to be adjacent to the stage 11. The probe card holder guide 21 includes a bifurcated fork 22 capable of mounting the probe card holder configured to hold the probe card 16. The probe card holder guide 21 is configured to be moved in the Y-direction and the Z-direction in the drawing and is also used in replacing the probe card 16.

Further, within the main body 12, an ASU camera 23 and a needle-tip polishing unit 24 (needle-tip polishing device) are provided between the stage 11 and the probe card holder guide 21, and an alignment bridge 25 is provided above the stage 11.

The ASU camera 23 and the needle-tip polishing unit 24 are fixed and connected to the stage 11 and configured to be moved together with the stage 11 in the Y-direction, the X-direction and the Z-direction in the drawing. The alignment bridge 25 is configured to be moved in the Y-direction in the drawing.

The ASU camera 23 moves to face the alignment bridge 25, and checks an accurate arrangement position of the stage 11 within the main body 12 by detecting a position mark (not illustrated) formed on the alignment bridge 25. The needle-tip polishing unit 24 moves toward the probe card 16 and polishes needle tips of the respective probe needles 17 of the probe card 16.

Figure 3:
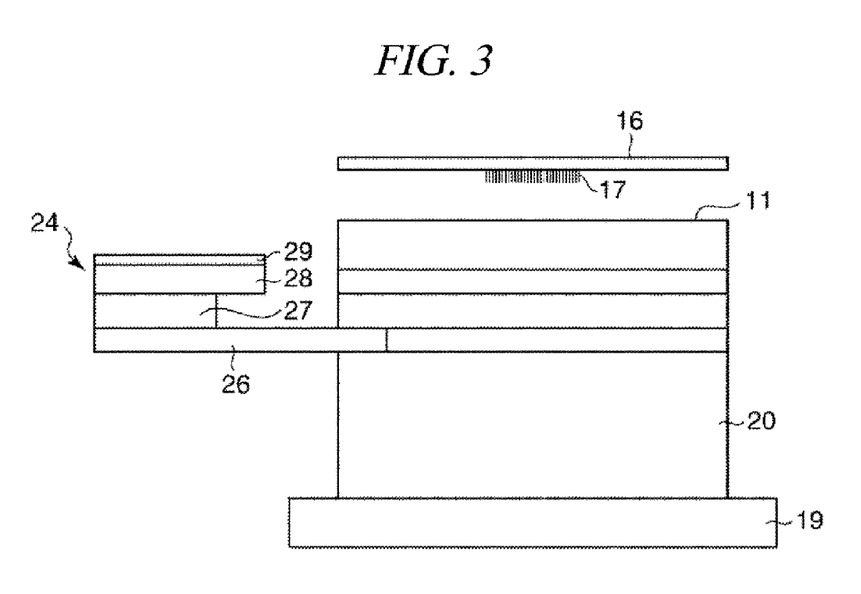
FIG. 3 is a side view schematically illustrating a configuration of a needle-tip polishing unit of FIG. 2.

FIG. 3 is a side view schematically illustrating a configuration of a needle-tip polishing unit of FIG. 2.

Further, in the following descriptions, an up and down direction corresponds to the Z-direction in FIG. 2, and in particular, an upward direction corresponds to a direction moving toward the probe card 16 and a downward direction corresponds to a direction moving away from the probe card 16. Further, a right and left direction corresponds to the X-direction and the Y-direction in FIG. 2.

In FIG. 3, the needle-tip polishing unit 24 is provided at a side of the stage 11 and includes a plate-shaped stay 26 fixed at the stage 11; a supporting member 27 (supporting unit) provided on a top surface of the stay 26; a plate-shaped WAPP 28 (needle-tip contact unit) provided on the supporting member 27; and a wrapping sheet 29 provided on a top surface (needle-tip polishing surface) of the WAPP 28. The stay 26, the supporting member 27, and the WAPP 28 are made of a high-rigidity material such as steel or aluminum.

Further, the needle-tip polishing unit 24 includes a lifting unit (not illustrated) configured to separate the WAPP 28 from the supporting member 27 by moving up the WAPP 28; and an actuator (not illustrated) configured to move the supporting member 27 on the stay 26 in the right and left direction. In particular, the lifting unit moves up the WAPP 28 such that a top surface of the wrapping sheet 29 can be located at a position higher than a top surface of the stage 11.

When the needle tips of the probe needles 17 of the probe card 16 are polished by the needle-tip polishing unit 24, the stage 11 is moved in the right and left direction such that the wrapping sheet 29 of the needle-tip polishing unit 24 can be arranged to face the probe needles 17. Then, when the wrapping sheet 29 is arranged to face the probe needles 17, the Z-direction moving unit 20 moves the stage 11 upwards and the lifting unit of the needle-tip polishing unit 24 also moves the WAPP 28 upwards. Thus, the WAPP 28 is moved upwards to a position (contact position) at which the wrapping sheet 29 is in contact with the needle tips of the respective probe needles 17.

Meanwhile, when the needle tips of the probe needles 17 of the probe card 16 are not polished, the lifting unit moves the WAPP 28 downwards and the Z-direction moving unit 20 also moves the stage 11 downwards. Thus, the WAPP 28 is moved downwards to a position (retreat position) at which the top surface of the wrapping sheet 29 can be located at a position lower than the top surface of the stage 11.

Figure 4A:
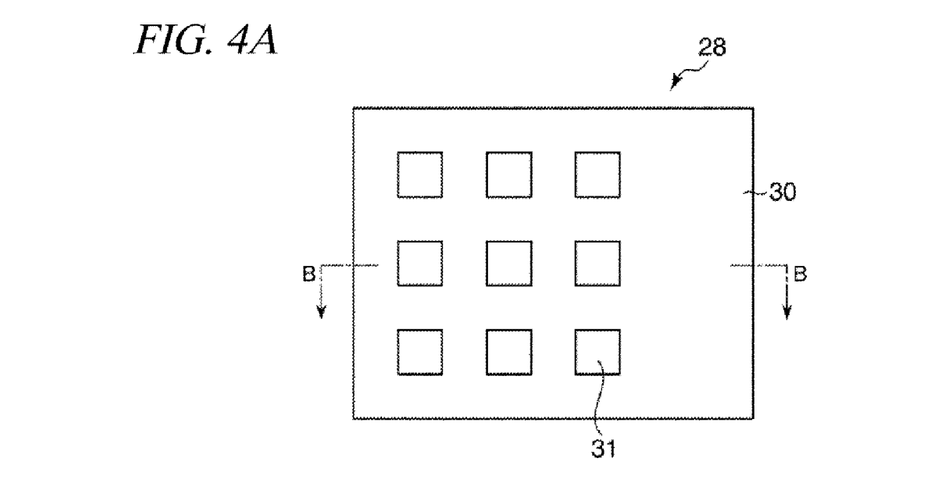
FIG. 4A is a bottom view of the WAPP.
Figure 4B:
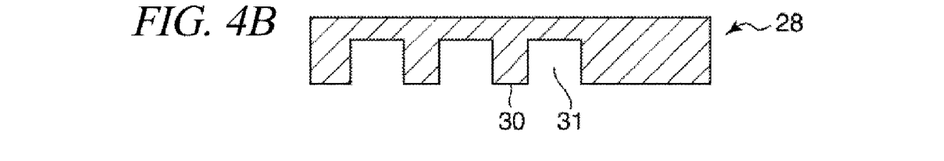
FIG. 4B is a cross-sectional view taken along a line B-B of FIG. 4A.
Figure 4C:
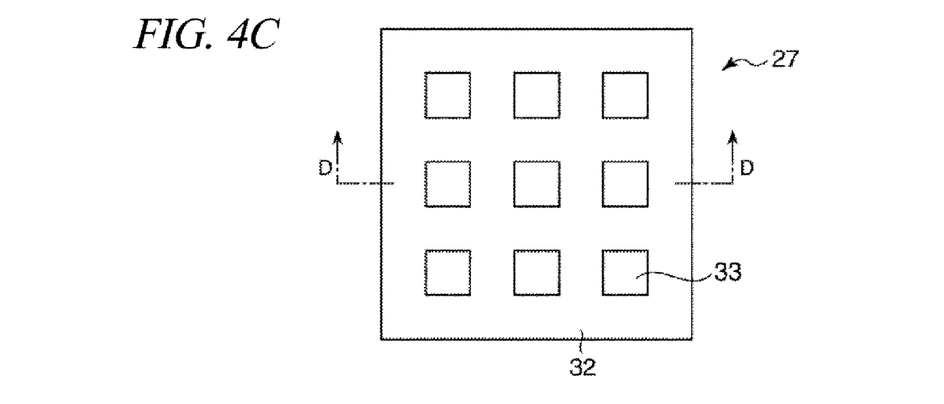
FIG. 4C is a plane view of the supporting member.
Figure 4D:
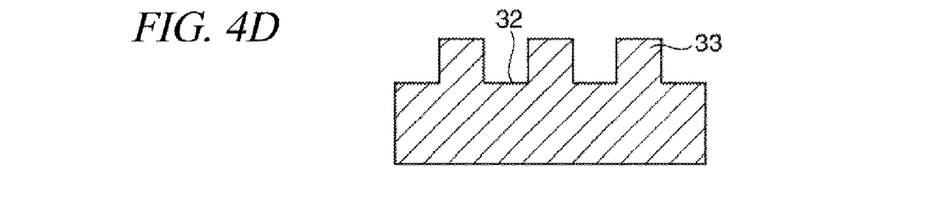
FIG. 4D is a cross-sectional view taken along a line D-D of FIG. 4C.

FIG. 4A to FIG. 4D are diagrams provided to explain shapes of the WAPP and the supporting member of the needle-tip polishing unit of FIG. 3, and specifically, FIG. 4A is a bottom view of the WAPP, FIG. 4B is a cross-sectional view taken along a line B-B of FIG. 4A, FIG. 4C is a plane view of the supporting member, and FIG. 4D is a cross-sectional view taken along a line D-D of FIG. 4C.

In FIG. 4A and FIG. 4B, the WAPP 28 includes multiple rectangular column-shaped recesses 31 which are formed at a bottom surface 30 (first facing surface) of the WAPP 28 facing the supporting member 27 and upwardly recessed from the bottom surface 30. Further, the supporting member 27 includes multiple rectangular column-shaped protrusions 33 which are formed at a ceiling surface 32 (second facing surface) of the supporting member 27 facing the WAPP 28 and upwardly protruded from the ceiling surface 32. When the WAPP 28 faces the supporting member 27, the protrusions 33 are arranged to directly face the recesses 31, respectively, and each of the protrusions 33 has a size to be accommodated in the corresponding recess 31.

In the needle-tip polishing unit 24, if the WAPP 28 is moved downwards to the retreat position, a top portion of each protrusion 33 is brought into contact with a bottom portion of the corresponding recess 31, so that it is possible to suppress the WAPP 28 from being further moved downwards.

FIG. 5A to FIG. 5E are process diagrams illustrating a needle-tip polishing process of the probe needles of the probe card by the needle-tip polishing unit of FIG. 3.

Figure 5A:
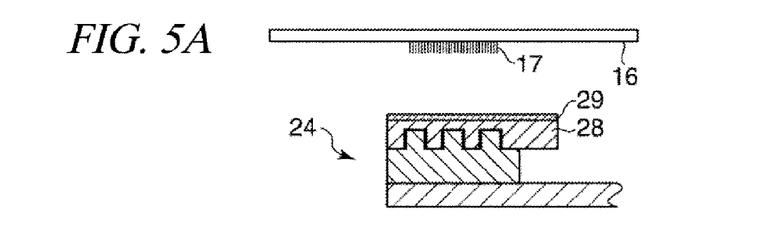
FIG. 5A to FIG. 5E are process diagrams illustrating a needle-tip polishing process of probe needles of a probe card by the needle-tip polishing unit of FIG. 3.

Firstly, accurate arrangement positions of the stage 11 and the needle-tip polishing unit 24 are checked by the ASU camera 23, and then, the stage 11 moves the needle-tip polishing unit 24 including the WAPP 28, which is moved downwards to the retreat position, to arrange the wrapping sheet 29 to face the probe needles 17 of the probe card 16 (FIG. 5A).

Figure 5B:
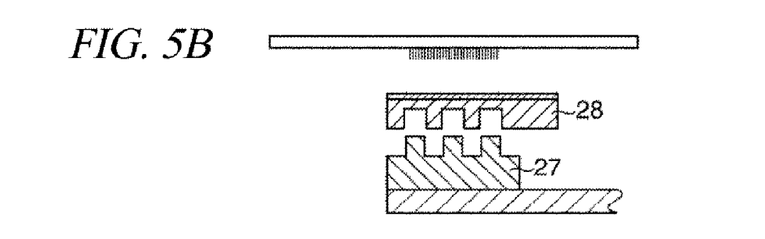
Figure 5C:
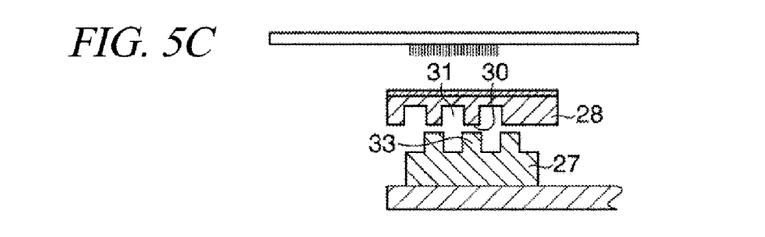

Then, the lifting unit moves the WAPP 28 upwards and separates the WAPP 28 from the supporting member 27 (FIG. 5B). Thus, the WAPP 28 and the supporting member 27 are not engaged with each other. At this time, the actuator moves the supporting member 27 in the right and left direction to arrange the top portions of the protrusions 33 to respectively face portions on the bottom surface 30 of the WAPP 28 where the recesses 31 are not formed (FIG. 5C).

Figure 5D:
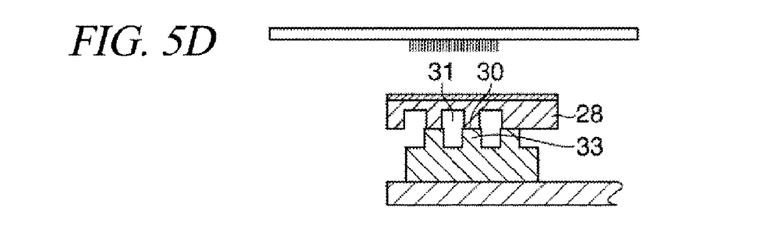
Figure 5E:
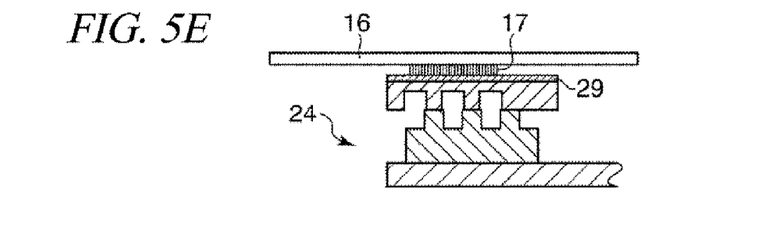

Then, the lifting unit moves the WAPP 28 downwards to respectively bring the top portions of the protrusions 33 into contact with the portions on the bottom surface 30 of the WAPP 28 where the recesses 31 are not formed (FIG. 5D). Thus, the WAPP 28 is lifted upwards and a position thereof is maintained.

Thereafter, the Z-direction moving unit 20 moves upwards the stage 11 together with the needle-tip polishing unit 24, and the WAPP 28 is moved to the contact position at which the wrapping sheet 29 is in contact with the needle tips of the probe needles 17. Then, the wrapping sheet 29 polishes the needle tips of the probe needles 17 (FIG. 5E), and the present process is ended.

According to the needle-tip polishing process of FIG. 5A to FIG. 5E, when the WAPP 28 is moved to the contact position and receives a reaction force from the needle tips of the respective probe needles 17, the top portions of the protrusions 33 are brought into contact with the portions on the bottom surface 30 of the WAPP 28 where the recesses 31 are not formed. That is, the top portions of the protrusions 33 and the bottom surface 30 each made of a high-rigidity material are mechanically engaged with each other, so that it is possible to suppress the WAPP 28 from being returned to the retreat position from the contact position by the reaction force from the needle tips of the respective probe needles 17. As a result, the WAPP 28 can stay at the contact position, so that it is possible to reliably press the wrapping sheet 29 against the needle tips of the respective probe needles 17.

FIG. 6A to FIG. 6E are process diagrams illustrating a needle-tip polishing process of the probe needles of the probe card by a first modification example of the needle-tip polishing unit of FIG. 3.

Figure 6A:
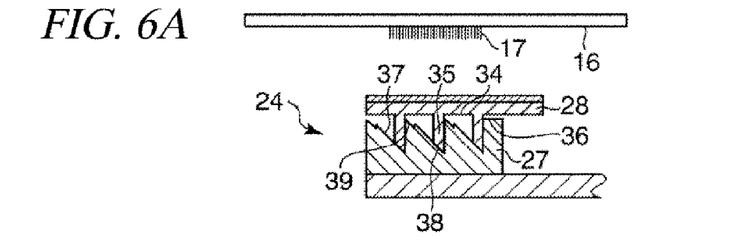
FIG. 6A to FIG. 6E are process diagrams illustrating a needle-tip polishing process of the probe needles of the probe card in accordance with a first modification example of the needle-tip polishing unit of FIG. 3.

In FIG. 6A, the WAPP 28 includes multiple rectangular column-shaped protrusions 35 which are formed at a bottom surface 34 (first facing surface) of the WAPP 28 facing the supporting member 27 and downwardly protruded from the bottom surface 34. Further, leading ends of the protrusions 35 are inclined. The supporting member 27 includes multiple recesses 37 which are formed at a ceiling surface 36 (second facing surface) of the supporting member 27 facing the WAPP 28 and downwardly recessed from the ceiling surface 36. Further, bottom surfaces of the recesses 37 are inclined. When the WAPP 28 faces the supporting member 27, the recesses 37 are arranged to directly face the protrusions 35, respectively, and each of the protrusions 35 has a size to be accommodated in the corresponding recess 37.

Each of the recesses 37 includes a lower contact portion 38 (first contact portion) which is in contact with a top portion of the corresponding protrusion 35 at a bottom surface thereof; and an upper contact portion 39 (second contact portion) which is formed above the lower contact portion 38 and in contact with the top portion of the corresponding protrusion 35.

In the first modification example of the needle-tip polishing unit, when the WAPP 28 is moved downwards to the retreat position, the top portions of the protrusions 35 are respectively brought into contact with the corresponding lower contact portions 38, so that it is possible to suppress the WAPP 28 from being further moved downwards.

In the needle-tip polishing process of the probe needles of the probe card by the first modification example of the needle-tip polishing unit, in the same manner as the needle-tip polishing process as depicted in FIG. 5A to FIG. 5E, firstly, the stage 11 moves the needle-tip polishing unit 24 including the WAPP 28, which is moved downwards to the retreat position, to arrange the wrapping sheet 29 to face the probe needles 17 of the probe card 16 (FIG. 6A).

Figure 6B:
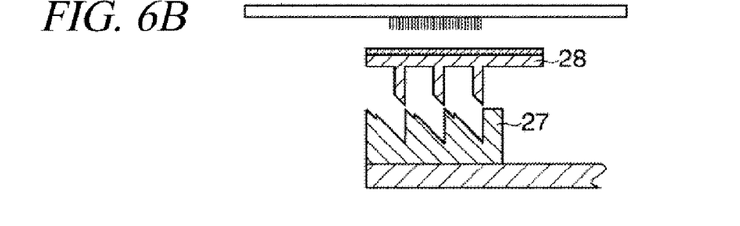
Figure 6C:
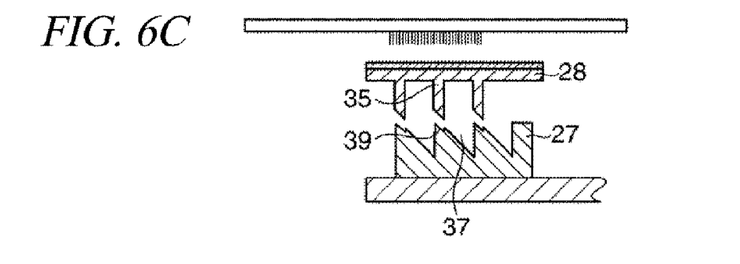

Then, the lifting unit moves the WAPP 28 upwards and separates the WAPP 28 from the supporting member 27 (FIG. 6B). Thus, the WAPP 28 and the supporting member 27 are not engaged with each other. At this time, the actuator moves the supporting member 27 in the right and left direction to arrange the top portions of the protrusions 35 to respectively face the upper contact portions 39 of the corresponding recesses 37 (FIG. 6C).

Figure 6D:
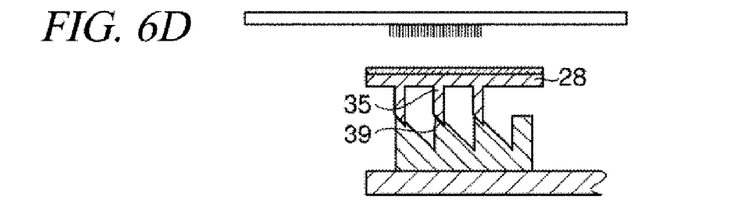
Figure 6E:
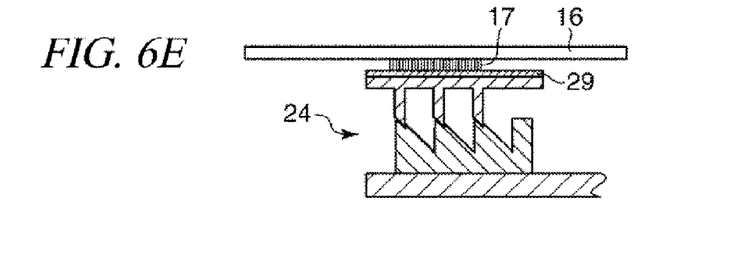

Then, the lifting unit moves the WAPP 28 downwards to respectively bring the top portions of the protrusions 35 into contact with the corresponding upper contact portions 39 (FIG. 6D). Thus, the WAPP 28 is lifted upwards and a position thereof is maintained.

Then, the Z-direction moving unit 20 moves upwards the stage 11 together with the needle-tip polishing unit 24, and the WAPP 28 is moved to the contact position at which the wrapping sheet 29 is in contact with the needle tips of the probe needles 17. Then, the wrapping sheet 29 polishes the needle tips of the probe needles 17 (FIG. 6E), and the present process is ended.

According to the needle-tip polishing process of FIG. 6A to FIG. 6E, when the WAPP 28 is moved to the contact position and receives a reaction force from the needle tips of the respective probe needles 17, the top portions of the protrusions 35 of the WAPP 28 are respectively brought into contact with the upper contact portions 39 formed above the lower contact portions 38 of the supporting member 27. That is, the top portions of the protrusions 35 and the upper contact portions 39 each made of a high-rigidity material are mechanically engaged with each other, so that it is possible to suppress the WAPP 28 from being returned to the retreat position from the contact position by the reaction force from the needle tips of the respective probe needles 17.

FIG. 7A to FIG. 7D are process diagrams illustrating a needle-tip polishing process of the probe needles of the probe card by a second modification example of the needle-tip polishing unit of FIG. 3.

In FIG. 7A to FIG. 7D, the WAPP 28 includes multiple protrusions 42 which are formed at a bottom surface 40 (first facing surface) of the WAPP 28 facing the supporting member 27 and downwardly protruded from the bottom surface 40. Further, each of the protrusions 42 has a projection 41 (engagement protrusion) projected from a side thereof. The supporting member 27 includes multiple recesses 45 which are formed at a ceiling surface 43 (second facing surface) of the supporting member 27 facing the WAPP 28 and downwardly recessed from the ceiling surface 43. Further, each of the recesses 45 has an engagement groove 44 formed at a side surface thereof. When the WAPP 28 faces the supporting member 27, the recesses 45 are arranged to directly face the protrusions 42, respectively, and each of the protrusions 42 has a size to be accommodated in the corresponding recess 45.

Figure 7A:
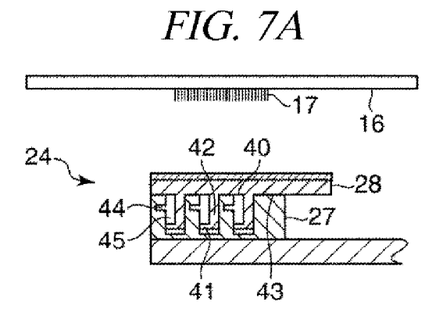
FIG. 7A to FIG. 7D are process diagrams illustrating a needle-tip polishing process of the probe needles of the probe card in accordance with a second modification example of the needle-tip polishing unit of FIG. 3.
Figure 7B:
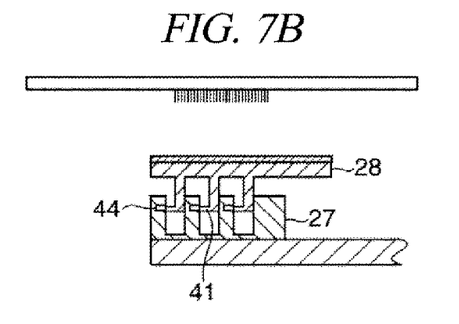

In the second modification example of the needle-tip polishing unit, when the WAPP 28 is moved downwards to the retreat position, the protrusions 42 are respectively accommodated in the corresponding recesses 45, and, thus, the bottom surface 40 is brought into contact with the ceiling surface 43, so that it is possible to suppress the WAPP 28 from being further moved downwards. In this case, the engagement groove 44 is located at a position above the projection 41.

In the needle-tip polishing process of the probe needles of the probe card by the second modification example of the needle-tip polishing unit, in the same manner as the needle-tip polishing process as depicted in FIG. 5A to FIG. 5E, firstly, the stage 11 moves the needle-tip polishing unit 24 including the WAPP 28, which is moved downwards to the retreat position to arrange the wrapping sheet 29 to face the probe needles 17 of the probe card 16 (FIG. 7A).

Figure 7C:
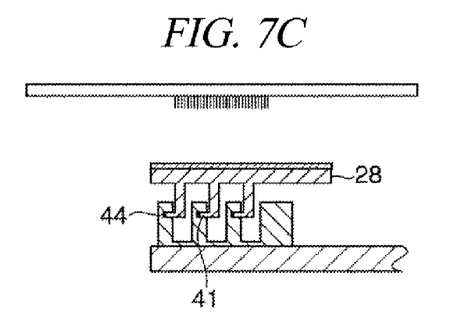
Figure 7D:
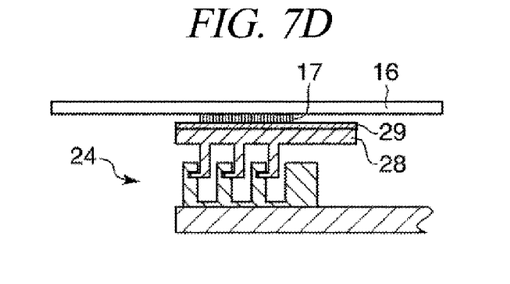

Then, the lifting unit moves the WAPP 28 upwards and the projections 41 are arranged to directly confront the engagement grooves 44 (FIG. 7B), respectively. At this time, the actuator moves the supporting member 27 in the right and left direction to control the projections 41 to respectively enter the engagement grooves 44. As a result, the projections 41 are respectively engaged with the engagement grooves 44 (FIG. 7C). Thus, the WAPP 28 is lifted upwards and a position thereof is maintained.

Thereafter, the Z-direction moving unit 20 moves upwards the stage 11 together with the needle-tip polishing unit 24, and the WAPP 28 is moved to the contact position at which the wrapping sheet 29 is in contact with the needle tips of the probe needles 17. Then, the wrapping sheet 29 polishes the needle tips of the probe needles 17 (FIG. 7D), and the present process is ended.

According to the needle-tip polishing process of FIG. 7A to FIG. 7D, when the WAPP 28 is moved to the contact position and receives a reaction force from the needle tips of the respective probe needles 17, the projections 41 respectively projected from the protrusions 42 of the WAPP 28 toward the side thereof enter the engagement grooves 44 respectively formed at the side surfaces of the recesses 45 of the supporting member 27 to be engaged with the engagement grooves 44. That is, the projections 41 of the protrusions 42 and the engagement grooves 44 of the recesses 45 each made of a high-rigidity material are mechanically engaged with each other, so that it is possible to suppress the WAPP 28 from being returned to the retreat position from the contact position by the reaction force from the needle tips of the respective probe needles 17.

The present disclosure has been explained above with reference to the example embodiments, but is not limited to the above example embodiments.

Figure 8A:
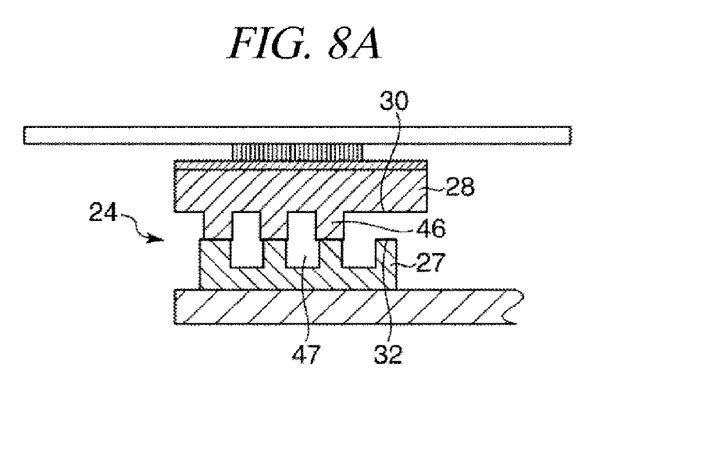

By way of example, in the needle-tip polishing unit 24, the WAPP 28 includes the multiple recesses 31 formed at the bottom surface 30, and the supporting member 27 includes the multiple protrusions 33 formed at the ceiling surface 32. However, as depicted in FIG. 8A, the WAPP 28 may include multiple rectangular column-shaped protrusions 46 downwardly protruded from the bottom surface 30, and the supporting member 27 may include multiple rectangular column-shaped recesses 47 downwardly recessed from the ceiling surface 32.

In this case, when the WAPP 28 is moved downwards to the retreat position, top portions of the protrusions 46 are respectively brought into contact with bottom portions of the corresponding recesses 47, so that it is possible to suppress the WAPP 28 from being further moved downwards. After the WAPP 28 is moved to the contact position, the top portions of the protrusions 46 are respectively brought into contact with portions on the ceiling surface 32 where the recesses 47 are not formed. Thus, the WAPP 28 is held at the contact position.

Figure 8B:
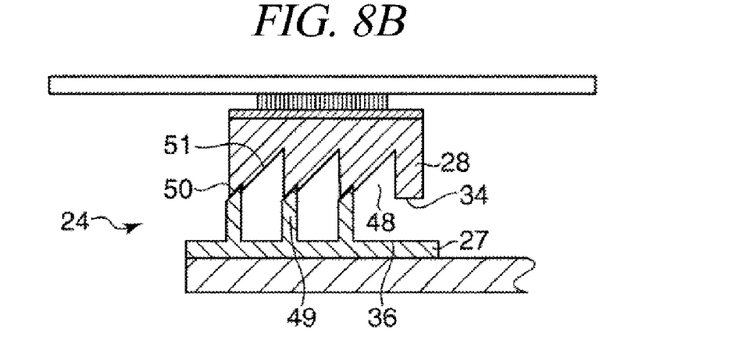
FIG. 8B illustrates the fourth modification example.

Further, in the first modification example of the needle-tip polishing unit 24, the WAPP 28 includes the multiple protrusions 35 formed at the bottom surface 34 and the supporting member 27 includes the multiple recesses 37 formed at the ceiling surface 36. Moreover, each of the recesses 37 has the lower contact portion 38 and the upper contact portion 39. However, as depicted in FIG. 8B, the WAPP 28 may include multiple recesses 48 which are formed at the bottom surface 34 and upwardly recessed from the bottom surface 34. Further, a bottom surface of each of the recesses 48 is inclined. Furthermore, the supporting member 27 may include multiple rectangular column-shaped protrusions 49 which are upwardly protruded from the ceiling surface 36. Here, leading ends of each of the protrusions 49 is inclined. When the WAPP 28 faces the supporting member 27, the recesses 48 are arranged to directly face the protrusions 49, respectively. Each of the protrusions 49 may have a size to be accommodated in the corresponding recess 48. Each of the recesses 48 may include a lower contact portion 50 which is in contact with a top portion of the corresponding protrusion 49 at a bottom surface thereof; and an upper contact portion 51 which is formed above the lower contact portion 50 and in contact with the top portion of the corresponding protrusion 49.

In this case, when the WAPP 28 is moved downwards to the retreat position, the top portions of the protrusions 49 are respectively brought into contact with the upper contact portions 51, so that it is possible to suppress the WAPP 28 from being further moved downwards. After the WAPP 28 is moved to the contact position, the top portions of the protrusions 49 are respectively brought into contact with the lower contact portions 50. Thus, the WAPP 28 is held at the contact position.

Figure 8C:
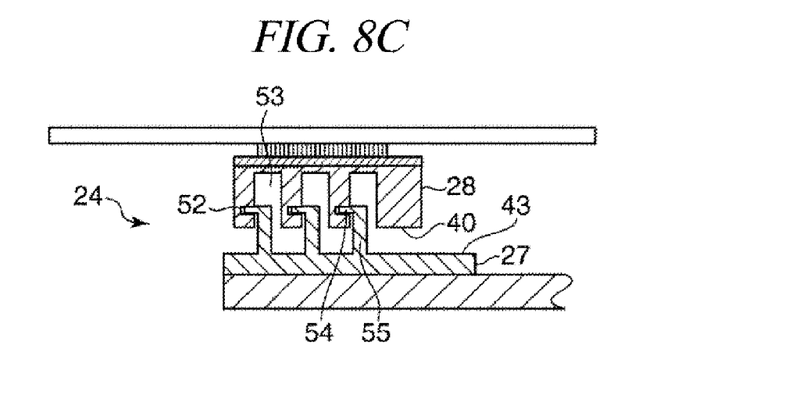

Further, in the second modification example of the needle-tip polishing unit 24, the WAPP 28 includes the multiple protrusions 42 which are formed on the bottom surface 40, and the supporting member 27 includes the multiple recesses 45 which are downwardly recessed from the ceiling surface 43. Further, each of the protrusions 42 has the projection 41 projected from the side thereof, and each of the recesses 45 has the engagement groove 44 at the side surface thereof. However, as depicted in FIG. 8C, the WAPP 28 may include multiple recesses 53 which are formed at the bottom surface 40 and upwardly recessed from the bottom surface 40, and the supporting member 27 may include multiple rectangular column-shaped protrusions 55 which are upwardly protruded from the ceiling surface 43. Further, each of the recesses 53 may have an engagement groove 52 at the side thereof, and each of the protrusions 55 has a projection 54 projected from the side thereof. Moreover, when the WAPP 28 faces the supporting member 27, the recesses 53 are arranged to directly face the protrusions 55, respectively. Each of the protrusions 55 may have a size to be accommodated in the corresponding recess 53.

Herein, when the WAPP 28 is moved downwards to the retreat position, the bottom surface 40 is brought into contact with the ceiling surface 43, so that it is possible to suppress the WAPP 28 from being further moved downwards. After the WAPP 28 is moved to the contact position, the projections 54 are respectively engaged with the engagement grooves 52, so that the WAPP 28 is held at the contact position.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A prober having a stage that mounts a substrate thereon and a probe card that is provided to face the stage and has multiple probe needles protruded toward the mounted substrate, the prober comprising:
   a needle-tip polishing device configured to polish needle tips of the multiple probe needles,
   wherein the needle-tip polishing device includes a needle-tip contact unit contacted with the needle tips and a supporting unit configured to support the needle-tip contact unit,
   a needle-tip polishing surface configured to polish the needle tips is formed on a portion of the needle-tip contact unit which is contacted with the needle tips,
   the needle-tip contact unit is provided between the probe card and the supporting unit and moved between a retreat position where the needle-tip contact unit is not in contact with the needle tips and a contact position where the needle-tip contact unit is in contact with the needle tips,
   the needle-tip contact unit includes a first facing surface provided to face the supporting unit,
   the supporting unit includes a second facing surface provided to face the needle-tip contact unit, and
   the needle-tip contact unit and the supporting unit include an engagement unit configured to be mechanically engaged with each other such that the first facing surface and the second facing surface are maintained to be separated from each other when the needle-tip contact unit is moved to the contact position and receive a reaction force from the needle tips.

2. The prober of claim 1,
   wherein the engagement unit includes a recess formed at one of the first facing surface and the second facing surface and a protrusion formed on the other of the first facing surface and the second facing surface,
   when the needle-tip contact unit is moved to the retreat position, the protrusion is inserted and fitted into the recess, and
   when the needle-tip contact unit is moved to the contact position, a top portion of the protrusion is brought into contact with the first facing surface or the second facing surface.

3. The prober of claim 1,
   wherein the engagement unit includes a recess formed at one of the first facing surface and the second facing surface and a protrusion formed at the other of the first facing surface and the second facing surface,
   the protrusion is inserted and fitted into the recess,
   the recess includes a first contact portion which is contacted with a top portion of the protrusion and a second contact portion which is formed in the vicinity of the needle-tip contact unit than the first contact portion and contacted with the top portion of the protrusion,
   when the needle-tip contact unit is moved to the retreat position, the top portion of the protrusion is brought into contact with the first contact portion, and
   when the needle-tip contact unit is moved to the contact position, the top portion of the protrusions is brought into contact with the second contact portion.

4. The prober of claim 1,
   wherein the engagement unit includes a recess formed at one of the first facing surface and the second facing surface and a protrusion formed at the other of the first facing surface and the second facing surface,
   the protrusion is inserted and fitted into the recess,
   the recess has an engagement groove formed at a side surface thereof and the protrusion has an engagement projection projected toward the side surface thereof, and
   when the needle-tip contact unit is moved to the contact position, the engagement projection enters the engagement groove to be engaged with the engagement groove.

5. The prober of claim 1,
   wherein the needle-tip polishing device is fixed to the stage and moved together with the stage toward the probe card when the stage is moved toward the probe card.

6. A needle-tip polishing device that polishes needle tips of multiple probe needles protruded from a probe card toward a substrate, the needle-tip polishing device comprising:
   a needle-tip contact unit contacted with the needle tips; and
   a supporting unit configured to support the needle-tip contact unit,
   wherein a needle-tip polishing surface configured to polish the needle tips is formed on a portion of the needle-tip contact unit which is contacted with the needle tips,
   the needle-tip contact unit is provided between the probe card and the supporting unit, and moved between a retreat position where the needle-tip contact unit is not in contact with the needle tips and a contact position where the needle-tip contact unit is in contact with the needle tips,
   the needle-tip contact unit includes a first facing surface provided to face the supporting unit,
   the supporting unit includes a second facing surface provided to face the needle-tip contact unit, and
   the needle-tip contact unit and the supporting unit include an engagement unit configured to be mechanically engaged with each other such that the first facing surface and the second facing surface are maintained to be separated from each other when the needle-tip contact unit is moved to the contact position and receives a reaction force from the needle tips.

* * * * *